June 13, 1967 M. BELASCO ET AL 3,325,704

HIGH FREQUENCY COAXIAL TRANSISTOR PACKAGE

Filed July 31, 1964

United States Patent Office 3,325,704

Patented June 13, 1967

3,325,704

HIGH FREQUENCY COAXIAL TRANSISTOR PACKAGE

Melvin Belasco, Dallas, Saul Noren, Richardson, and Roger R. Webster, Dallas, Tex., assignors to Texas Instruments Incorporated, Dallas, Tex., a corporation of Delaware Filed July 31, 1964, Ser. No. 386,719
3 Claims. (Cl. 317—234)

This invention relates to transistors operable at frequencies in the thousands of megacycles and more particularly to a coaxially mounted transistor unit. In a further aspect, the invention relates to a coaxially mounted transistor unit in which connections to transistor terminals are completed by way of metal-coated ceramic bodies forming part of the transistor package.

Conventional packages for transistors may have characteristics which degrade the performance of the transistor wafer inside the package, and of the electronic circuit in which the transistor is employed. This is especially true at frequencies in excess of 1 gigacycle per second hereinafter identified as "gc."

The degradation of performance results from parasitic elements inherent in the package such as inductance, capacitance and losses. Inductance and capacitance will often reduce the circuit gain, while package losses will always do so. Parasitic inductance and capacitance usually reduce the circuit stability, with the result that the transistor tends to oscillate more readily, and oscillation is more difficult to suppress. Moreover, the resonant frequency of the parasitic inductance and capacitance of the conventional package may occur at a desired operating frequency. Such resonance seriously degrades the transistor performance, and reduces its flexibility in circuit application.

Losses in ordinary transistor packages usually result from ferromagnetic materials. Such materials introduce substantial resistances into the package, particularly at frequencies in excess of 1 gc. While suitable plating will substantially reduce such losses, it is ordinarily not possible to realize such plating where glass-to-metal seals exist.

The mechanical configuration of the conventional transistor package is such that it is readily used in lumped parameter circuits. However, it is not well adapted for use in distributed parameter circuits, such as coaxial circuits. Since distributed parameter circuits are commonly employed at frequencies above 1 gc., this further limits the applicability of the conventional package at these frequencies.

The present invention further leads to reduced inductance and losses and substantially higher package resonant frequencies by avoiding all unplated ferromagnetic material, by reduced dimensions, and by broad area or large cross section conducting paths, rather than use of small dimension conductors.

In accordance with the invention, a pair of ceramic disks are bonded to a conducting cylindrical structure in spaced-apart relation to form a closed compartment. A first conductive terminal member extends axially of the first of the disks and is bonded thereto. A transistor wafer is mounted on the end of the first terminal member with one transistor terminal electrically common to the terminal member. A first metal film is provided on the first of the disks and is connected between a second transistor terminal and the cylindrical structure. A second metal film is provided on the first of the disks and is connected to a third terminal transistor. A second conductive terminal member is bonded to and extends axially into the second of the wafers and is connected across the compartment to the second metal film. The package terminals are the cylindrical structure and the two conductive terminal members oriented in a coaxial array.

For a more complete understanding of the present invention and for further objects and advantages thereof, reference may now be had to the following description taken in conjunction with the accompanying drawings in which.

Figures 1, 2, 3, 4, 5, 6, 7, 8, 9:
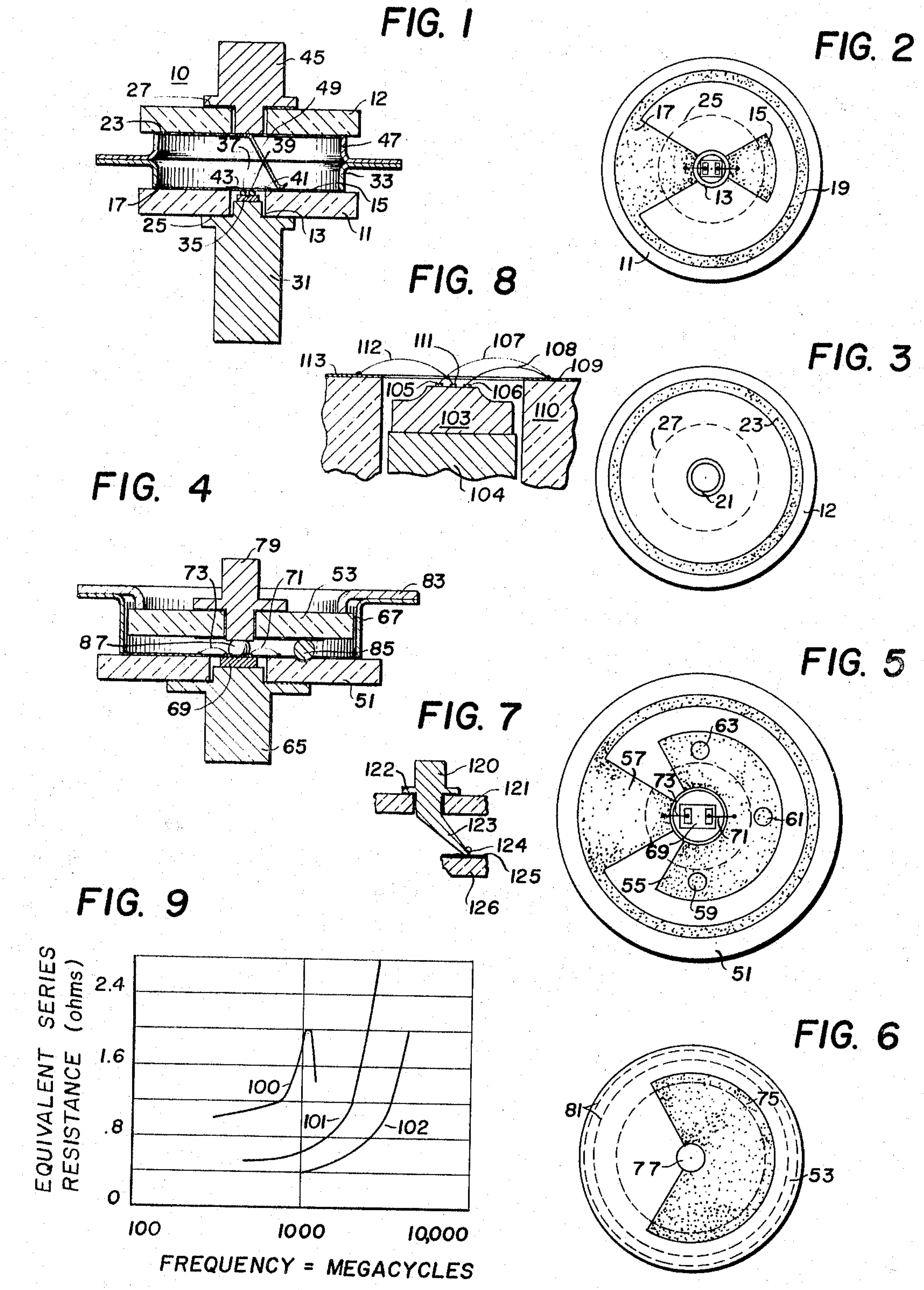
FIGURE 1 is a sectional view of one embodiment of the invention.
FIGURE 2 is a view of the upper surface of the lower disk of FIGURE 1.
FIGURE 3 is a view of the lower surface of the upper disk of FIGURE 1.
FIGURE 4 is a sectional view of another embodiment of the invention.
FIGURE 5 is a view of the upper surface of the lower disk of FIGURE 4.
FIG. 6 is a view of the lower surface of the upper disk of FIGURE 4.
FIGURE 7 illustrates a preferred form of contact element.
FIGURE 8 illustrates a three-stripe transistor construction.
FIGURE 9 is a graph showing performance of the present invention compared with the other high frequency systems.

FIGURE 1 illustrates a miniature hermetically sealed coaxially packaged transistor unit 10. Two ceramic disks 11 and 12 form a part of the package. Preferably the disks are made of alumina or beryllia ceramic. Other materials having similar and suitable properties will be satisfactory.

The upper surface of the lower disk 11 is shown in FIGURE 2. Metallic film patterns are deposited onto both disks 11 and 12. As shown in FIGURE 2, the disk 11 has a central aperture 13 extending axially therethrough. The metallic film coated onto the surface of disk 11 includes a first contact 15 which is an isolated area having a truncated fan shape bordering on the perimeter of the hole 13 and extending radially therefrom. A second contact 17 has a main body located diametrically opposite the contact 15 and includes a ring extension 19 which has its center at the center of the disk 11. A metal film 25 is also deposited on the bottom of disk 11, as indicated by the dotted ring, FIGURE 2.

The lower surface of the upper disk 12 is shown in FIGURE 3. Disk 12 has a central aperture 21 extending axially therethrough. The metallic coating on the lower surface of disk 12 comprises a single ring 23. The ring 23 is of the same diameter as the ring 19. A metal film 27 is applied to the upper surface of disk 12.

The metallic coatings are applied to the surfaces of the disks 11 and 12 by well-known techniques such as the silk screen process. They can also be applied by spraying through a mask or by pressing the patterns into the ceramic, dipping the ceramic into a film material, and then grinding the surfaces of the ceramic and the excess film to create the isolated areas. The films may be of any one of a number of suitable meals, such as, for example, molybdenum-manganese, moly-titanium or tungsten.

After the metal films are applied to the surfaces, the disks are fired hermetically to bond films to the ceramic disks. The metallic patterns are completed by plating the fired molybdenum-manganese layer with a suitable material such as nickel or copper, for example. However, some types of metallizing films will require no plating, as is well understood in the art.

The ceramic disks with nickel-plated metallized areas thereon are then placed in a graphite assembly boat (not shown) preparatory to securing suitable weld flanges thereto. The disk 11 is placed in the boat or brazing fixture with the contact pin 31 positioned in the aperture 13. Additionally, a flange cylinder 33 is held in position with the end of the cylinder in contact with the ring 19. Suitable material for the cylinder 33 may be the well-known nickel, iron, cobalt alloy sold under the trade name Kovar, since it presents a good thermal match to the ceramic. Nickel, however, may also be successfully used. Since Kovar and nickel are both ferromagnetic, they have a suitable plating or covering, such as gold, to reduce high frequency losses. Suitable material for the pin 31 may be copper. Because a semiconductor wafer is to be alloyed to the pin 31, copper is preferred because it readily conducts heat away from the semiconductor wafer. Any suitable brazing material may be used for securing the pin 31 to the metal film in the area 25 and the flange unit 33 to the ring 19. For example, a copper-silver eutectic alloy, a copper-gold alloy, or pure copper may be used. The brazing operation is carried out in a manner well known to those skilled in the art so that a unitary construction is completed which includes the disk 11, the pin 31 and the flange unit 33. After this is completed, the metal surfaces are then plated with gold. The unit thus constructed is ready to receive a transistor wafer or other semiconductor device. As shown in FIGURE 1, a transistor wafer 35 is alloyed onto the top of the pin 31. The wafer is provided with a pair of contact strips 37 and 39 which are connected by way of conductors 41 and 43 to the contact zones 15 and 17 respectively. With this construction completed, half of the transistor package is in final form.

The other half of the transistor package includes the disk 12. After the metallized films are placed thereon, the disk 12 is placed in a suitable brazing boat with the second contact pin 45 positioned against the film 27. A flanged cylinder 47 is held in contact with the ring 23. The two metal pieces 45 and 47 are then brazed onto the ceramic disk 12. When this is completed, a spring contact unit 49 may be secured to the end of the pin 45. Thereafter, the flanges on cylinders 33 and 47 are welded together to bring the contact 49 resiliently against the isolated contact area 15 on the lower disk 11. The two halves of the unit may be indexed for welding by well-known means such as tabs on the edges of the flanges.

FIGURE 4 illustrates a second embodiment of the invention in which the coaxial configuration is maintained and in which a different type of construction and different structure for electrical transfer to the upper terminal is employed. In this form, two disks 51 and 53 are employed with the disk 51 being substantially larger in diameter than the disk 53. The upper surface of the disk 51 is provided with two contact films 55 and 57, metallized as above described in connection with the system of FIGURE 1. Three spherical depressions 59, 61, and 63 are formed in the surface of the disk 51 in the area covered by the film 55. The opposite surface of the disk 51 is also metallized for brazing to the lower contact pin 65 shown in FIGURE 4. The disk 51, after receiving the metal films, is placed in a suitable fixture for welding to the contact pin 65 and to a flanged cylinder 67. After this is completed, the transistor wafer 69 is alloyed to the end surface of the pin 65. Leads 71 and 73 are then secured to the terminal strips of transistor 69 and extend to the contact films 55 and 57, respectively.

The upper disk 53 is shown in FIGURE 6. The lower surface of disk 53 is coated with a metallic film 75 which extends into the central aperture 77. The opposite surface of the disk 53 is coated for brazing to the upper contact pin 79 in the area bounded by the dotted circles 81. The upper disk is then placed in a brazing fixture in contact with the upper pin 79 and a flanged cylinder 83 wherein the bonding, as by brazing as above described, is completed. One, two, or three malleable metal spheres are then placed in the depressions 59, 61, and 63. As shown in FIGURE 4, the spheres are employed to complete an electrical circuit between film 55 on disk 51 and film 75 on disk 53.

Since film 75 extends into the central aperture 77 in disk 53, the circuit is by this means completed to the upper contact pin 79. The flanges on the elements 67 and 83 are then bonded, particularly at the outer rim thereof to complete the transistor package. By reason of the relatively long flanges present on the cylinders 67 and 83, the balls 85 and 87 resiliently are maintained in contact with disks 51 and 53. The flanges on the cylinders 67 and 83 are somewhat resilient to assure continued contact and electrical transfer by and through the malleable spheres 85 and 87.

In the embodiments shown in FIGURES 1 and 4, different types of construction are employed for completing the circuit to the upper pin. In FIGURE 1, the spring contact 49 is secured to the upper pin 45 and contacts a metal film on the lower disk. In FIGURE 4, the malleable balls 85 and 87 are employed for a comparable purpose. FIGURE 7 illustrates a preferred form of contact arrangement. More particularly, the upper contact pin 120 is secured to the disk 121, the flange 122 being brazed to a metal ring on the upper surface of the disk 121. A conical member 123 integral with pin 120 extends downwardly from disk 121 through a central aperture and terminates at point 124. The member 123 is sufficiently rigid as to embed the tip thereof in the metallized coating 125 on the upper surface of the lower disk 126. Thus, while the embodiments shown in FIGURES 1 and 4 may be suitable, the contact construction of FIGURE 7 is preferred.

In the embodiment of FIGURE 5, the package is coaxial in form and employs a semiconductor wafer of the PNP type having a two-stripe geometry. The transistor wafer 69 is secured to the contact pin 65 to form one terminal. A first contact stripe on the upper surface of the wafer 69 is connected by way of conductor 71 to film 55. The second contact stripe on the wafer 69 is connected by conductor 73 to the second contact film 57.

While the transistor shown in the foregoing figures is somewhat diagrammatic in form, a more detailed showing of another embodiment is provided in FIGURE 8. In this embodiment it will be seen that the transistor 103 is mounted on top of the contact pin 104. Transistor 103 is a mesa device in which the pin 104 forms the collector terminal. A pair of terminal stripes 105 and 106 are connected by way of leads 107 and 108 respectively to the film 109 on the lower ceramic disk 110. A center stripe 111 forms the emitter terminal. It is connected by way of conductor 112 to the layer 113 on the upper surface of the disk 110.

The three-stripe configuration of FIGURE 8 is advantageous in some applications. More particularly, a major problem of high frequency transistors is in gaining low impedance across the intrinsic transistor terminals. A comparison of equivalent series resistances for three different packages for the same transistor is shown in FIGURE 9. In this figure, the curve 100 represents the performance of a transistor package having a configuration generally known in the art as a TO–18 outline. It exhibits a peak in the resistance curve because of package resonance. Performance above that frequency is unpredictable. Curve 101 represents the operation of the same type transistor unit in a $\mu$-mesa transistor package manufactured and sold by Texas Instruments Inc., Dallas, Tex., as a $\mu$-mesa transistor package and further identified as a TO–50 configuration. This package operates at higher frequencies than the package represented by curve 100, and is useful in strip-line applications. The curve 102 represents operation of the transistor package of the present invention. Operation at still higher frequencies is possible with relatively low equivalent series resistance.

The specifications for TO–18 and TO–50 package outlines are described in Publication #12E of the Joint Electronic Device Engineering Council (JEDEC) entitled, "Registered Outlines and Gauges for Semiconductor Devices," published by the National Electrical Manufacturers Association and the Electronic Industries Association, Engineering Department, May 1964.

The three-stripe geometry illustrated in FIGURE 8 serves to reduce the base spreading resistance to below ten ohms.

By using a coaxial configuration of FIGURE 5, along with a three-stripe geometry, the base spreading resistance is reduced while $f_T$ is maintained high at high collector currents and the flanges 67 and 83 provide a low reactance path to the intrinsic transistor base.

The leads connected from the stripes on the transistor wafer are to be selectively connected to the flange and to the contact pin in the upper wafer in dependence upon the mode of operation of the transistor.

A base disk and a cover disk of ceramic are coupled by the conductive cylindrical structure to form a closed compartment inside of which the transistor is mounted. The transistor mounting includes a conductive stud or terminal member which extends axially into an aperture in the base disk and is bonded thereto. The stud forms one transistor connection point. A conductive metal film on the base disk is connected between a second terminal on the transistor and the conductive cylindrical structure which secures the disks together. The conductive cylindrical structure thus forms a second transistor connection point. A second metal film on the base disk is connected to a third terminal of the transistor. A second conductive stud or terminal member extends axially into an aperture in the cover disk and is bonded thereto. The stud in the cover disk is connected to the second metal film on the base disk. In a preferred form, the latter connection includes a conical extension angularly disposed with respect to the axis of the second stud and makes electrical contact with the second film on the base disk. The second stud then forms a third transistor connection point.

Having described the invention in connection with certain specific embodiments thereof, it is to be understood that further modifications may now suggest themselves to those skilled in the art and it is intended to cover such modifications as fall within the scope of the appended claims.

What is claimed is:

1. A high frequency coaxial transistor package which comprises:

(a) a ceramic base disk having metallic films bonded thereto in a pattern including a first ring encircling a central aperture through said base disk and a first inwardly extending film zone terminating at the periphery of said aperture, a second film zone diametrically across said aperture from said first zone and isolated from said first zone and a second ring encircling said aperture on the face of said base disk opposite said first ring, (b) a first flanged conductive metal stud having one end extending into said apertures with a face of the flange thereon brazed to said second ring, (c) a transistor mounted on said end of said stud with one terminal connected thereto, a second terminal connected to said first film zone, and a third terminal connected to said second film zone, (d) a ceramic cover disk having a metallic film bonded to one surface in a ring pattern surrounding a central aperture therethrough, (e) a second flanged conductive metal stud having one end extending into said aperture in said cover disk and secured to the metal film thereon and electrically connected to said second film zone, and (f) a conductive metal cylinder structure brazed to said first ring and to said cover disk to maintain the connection between said second stud and said second film zone.

2. A high frequency coaxial transistor package which comprises:

(a) a first ceramic disk having an aperture therethrough, a first metallic film bonded to the top surface of said first ceramic disk, said first metallic film having a pattern that includes a ring encircling said aperture and a portion extending toward said aperture, a second metallic film bonded to said top surface and disposed within and isolated from said first film; a third metallic film bonded to the bottom surface of said first ceramic disk and surrounding said aperture, (b) a first flanged electrically conductive metal stud having one end extending into said aperture of said first ceramic disk from the bottom side thereof, the flange of said first metal stud being bonded to said third metallic film, (c) a transistor mounted on said one end of said first flanged electrically conductive metal stud, one terminal of said transistor being connected thereto, a second transistor terminal connected to said first metallic film, and a third transistor terminal connected to said second metallic film, (d) a first electrically conductive cylinder having an outwardly extending flange at one end, the opposite end of said cylinder being bonded to said first metallic film, (e) a second ceramic disk having an aperture therethrough, a fourth film bonded to the top surface of said disk surrounding said aperture, a fifth metallic film bonded to the top surface of said disk disposed within and isolated from said fourth metallic film, (f) a second flanged electrical conductive metal stud having one end extending into said aperture of said second ceramic disk from the top surface thereof, the flange of said second metal stud being bonded to said fifth metallic film, (g) a second electrically conductive cylinder having an outwardly extended flange at one end, the opposite end of said cylinder being bonded to said fourth metallic film, the flange of said first electrically conductive cylinder being bonded to the flange of said second electrically conductive cylinder, and (h) means for connecting said second flanged electrically conductive metal stud to said second metallic film on said top surface of said first ceramic disk, whereby said first flanged electrically conductive metal stud makes electrical contact with said one transistor terminal, said bonded first and second electrically conductive cylinders make contact with said second transistor terminal, and said second flanged electrically conductive metal stud makes electrical contact with said third transistor terminal.

3. The high frequency coaxial transistor package as defined in claim 2 wherein said means for connecting said second flanged electrical conductive metal stud to said second metallic film on said first ceramic disk includes a sixth metallic film on the bottom surface of said second ceramic disk, said sixth metallic film being electrically connected to said second flanged electrical conductive metal stud, and one or more malleable electrically conductive spheres being in electrical contact with said second metallic film on said first ceramic disk and said sixth metallic film on said second ceramic disk.

(References on following page)

References Cited

UNITED STATES PATENTS

| | | | |
|---|---|---|---|
| 2,876,401 | 3/1959 | Fuller | 317—235 |
| 3,021,461 | 2/1962 | Oakes et al. | 317—235 |
| 3,028,663 | 4/1962 | Iwersen et al. | 317—235 |
| 3,134,058 | 5/1964 | Walkow | 317—235 |
| 3,148,310 | 9/1964 | Feldman | 174—68.5 |
| 3,181,043 | 4/1965 | Colter | 317—235 |
| 3,184,831 | 5/1965 | Siebertz | 317—235 |
| 3,189,799 | 6/1965 | Moroney | 317—235 |
| 3,199,003 | 8/1965 | Turner | 317—235 |
| 3,202,888 | 8/1965 | Evander et al. | 317—234 |

FOREIGN PATENTS

| | | |
|---|---|---|
| 867,353 | 5/1961 | Great Britain. |
| 878,811 | 10/1961 | Great Britain. |

OTHER REFERENCES

Bell Lab. Record, "Microwave Transistor Mounts In Coaxial Shell," April 1960; vol. 38, No. 4, p. 141.

JOHN W. HUCKERT, *Primary Examiner.*

J. C. CRAIG, *Assistant Examiner.*